United States Patent
Yoshitake et al.

(10) Patent No.: US 8,772,812 B2
(45) Date of Patent: Jul. 8, 2014

(54) CURABLE ORGANOPOLYSILOXANE COMPOSITION AND OPTICAL SEMICONDUCTOR DEVICE

(75) Inventors: Makoto Yoshitake, Funabashi (JP); Mieko Yamakawa, Ichihara (JP)

(73) Assignee: Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 13/806,879

(22) PCT Filed: Jun. 28, 2011

(86) PCT No.: PCT/JP2011/065247
§ 371 (c)(1),
(2), (4) Date: Feb. 15, 2013

(87) PCT Pub. No.: WO2012/002560
PCT Pub. Date: Jan. 5, 2012

(65) Prior Publication Data
US 2013/0134609 A1    May 30, 2013

(30) Foreign Application Priority Data
Jun. 29, 2010    (JP) .............................. 2010-147690

(51) Int. Cl.
*H01L 33/00* (2010.01)
*H01L 31/0232* (2014.01)
*H01L 23/28* (2006.01)
*H01L 23/29* (2006.01)

(52) U.S. Cl.
USPC ............ 257/98; 257/100; 257/432; 257/435; 257/787; 257/791; 524/477; 524/588

(58) Field of Classification Search
USPC ................... 257/791, 98, 432, 435, E31.106, 257/E31.127, E21.527, E21.53, E21.261, 257/100, 787; 524/588, 477
See application file for complete search history.

(56) References Cited

U.S. PATENT DOCUMENTS

| 6,124,407 A | 9/2000 | Lee et al. |
| 7,592,399 B2 * | 9/2009 | Kodama ........................ 525/476 |

(Continued)

FOREIGN PATENT DOCUMENTS

| JP | 2006342200 A | 12/2006 |
| JP | 2007063538 A | 3/2007 |

(Continued)

OTHER PUBLICATIONS

English language abstract for JP 2006342200 extracted from espacenet.com database on Jan. 23, 2013, 1 page.

(Continued)

*Primary Examiner* — Matthew Reames
*Assistant Examiner* — Dilinh Nguyen
(74) *Attorney, Agent, or Firm* — Howard & Howard Attorneys PLLC

(57) ABSTRACT

A curable organopolysiloxane composition can be used as a sealant or a bonding agent for optical semiconductor elements. The composition comprises at least the following components: (A) a multi-constituent, alkenyl-containing organopolysiloxane; (B) an organopolysiloxane that contains silicon-bonded hydrogen atoms and comprises constituent (B-1) containing at least 0.5 wt. % of silicon-bonded hydrogen atoms and constituent (B-2) containing at least 0.5 wt. % of silicon-bonded hydrogen atoms, and, if necessary, constituent (B-3), an organopolysiloxane; and (C) a hydrosilylation-reaction catalyst. The composition can form a cured body that possesses long-lasting properties of light transmittance and bondability, and relatively high hardness.

18 Claims, 1 Drawing Sheet

(56) References Cited

U.S. PATENT DOCUMENTS 8,164,202 B2 * 4/2012 Kashiwagi et al. ........... 257/791
2006/0275617 A1 12/2006 Miyoshi et al.
2009/0118441 A1 5/2009 Yamamoto et al.

FOREIGN PATENT DOCUMENTS

| JP | 2008-120843 A | 5/2008 |
|----|---------------|--------|
| WO | WO 2009/017251 A1 | 5/2009 |
| WO | WO2012/002561 A1 | 1/2012 |

OTHER PUBLICATIONS

English language abstract and translation for JP 2007063538 extracted from PAJ database on Jan. 23, 2013, 50 pages.
English language abstract and translation for JP 2008-120843 extracted from PAJ database on Jan. 23, 2013, 31 pages.
International Search Report for Application PCT/JP2011/065248 dated Sep. 6, 2011, 3 pages.
International Search Report for Application PCT/JP2011/065247 dated Sep. 6, 2011, 3 pages.

* cited by examiner

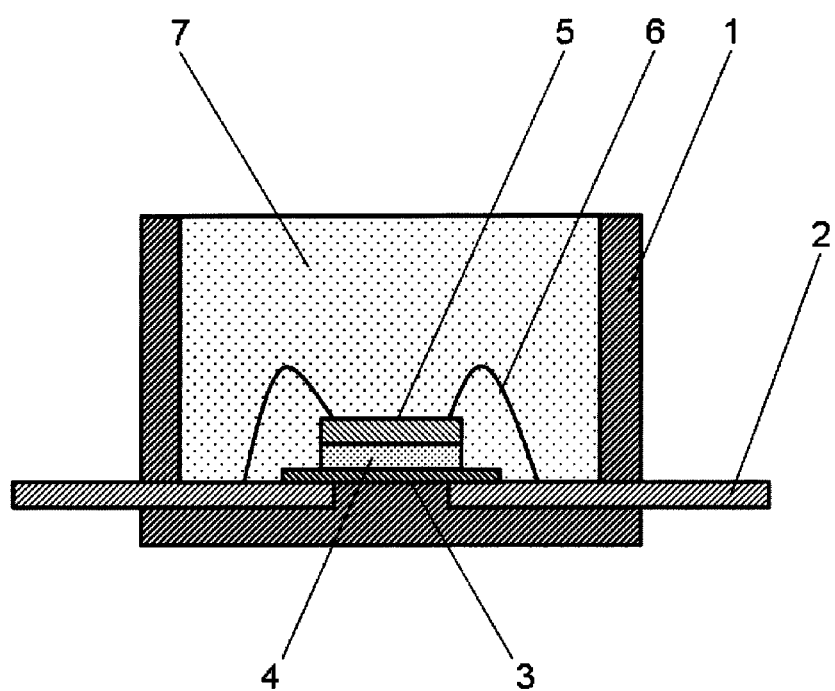

CURABLE ORGANOPOLYSILOXANE COMPOSITION AND OPTICAL SEMICONDUCTOR DEVICE

RELATED APPLICATIONS

This application is the National Stage of International Patent Application No. PCT/JP2011/065247, filed on Jun. 28, 2011, which claims priority to and all the advantages of Japanese Patent Application No. 2010-147690, filed on Jun. 29, 2010, the content of which is incorporated herein by reference.

TECHNICAL FIELD

The present invention relates to a curable organopolysiloxane composition and to an optical semiconductor device having an optical semiconductor element that is sealed and/or bonded with a cured body of the aforementioned composition.

BACKGROUND ART

Curable organopolysiloxane compositions are used for sealing and/or bonding optical semiconductor elements in optical semiconductor devices having optical semiconductor elements such as photocouplers, light-emitting diodes, solid-state image pickup elements, or the like. It is required that cured bodies of such compositions neither absorb nor scatter the light emitted or received from semiconductor elements. Furthermore, in order to improve reliability of the optical semiconductor devices, it is desired that the cured bodies could not discolor or decrease in the bonding strength.

Japanese Unexamined Patent Application Publication (hereinafter referred to as "Kokai") 2006-342200 discloses a curable organopolysiloxane composition that can form a cured body having high hardness and high light transmittance. However, the cured body produced from such a composition can be either easily damaged during manufacture or use of an optical semiconductor device, or can easily delaminate from the optical semiconductor element or a package of such element.

Furthermore, Kokai 2007-63538 and Kokai 2008-120843 disclose curable organopolysiloxane compositions that can form cured bodies having excellent impact-resistant properties. However, since with the lapse of time such cured bodies are subject to yellowing, they are not suitable for sealing or bonding optical semiconductor elements of optical semiconductor devices that are intended for long-time use at high temperatures.

It is an object of the present invention to provide a curable organopolysiloxane composition that can form a cured body having long-lasting properties of light transmittance and bondability, and having relatively high hardness. It is another object to provide an optical semiconductor device that possesses excellent reliability.

DISCLOSURE OF INVENTION

The curable organopolysiloxane composition of the invention comprises at least the following components:

(A) an alkenyl-containing organopolysiloxane that comprises 15 to 35 wt. % of constituent (A-1) and 65 to 85 wt. % of constituent (A-2), wherein constituent (A-1) comprises an organopolysiloxane of the following average compositional formula:

$$(R^1_3SiO_{1/2})_a(R^1_2SiO_{2/2})_b(R^1SiO_{3/2})_c(SiO_{4/2})_d$$

where $R^1$ designates phenyl groups, methyl groups, or alkenyl groups having 2 to 10 carbon atoms; 0.4 to 50 mole % of all $R^1$ groups are alkenyl groups having 2 to 10 carbon atoms; methyl groups constitute 90 mole % or more of the sum of methyl and phenyl groups contained in $R^1$; "a", "b", "c", and "d" are numbers that satisfy the following conditions: $0 \le a \le 0.05$; $0.9 \le b \le 1$; $0 \le c \le 0.03$; $0 \le d \le 0.03$; and $a+b+c+d=1$;

constituent (A-2) comprises an organopolysiloxane of the following average compositional formula:

$$(R^2_3SiO_{1/2})_e(R^2_2SiO_{2/2})_f(R^2SiO_{3/2})_g(SiO_{4/2})_h(HO_{1/2})_i$$

where $R^2$ designates phenyl groups, methyl groups, or alkenyl groups having 2 to 10 carbon atoms; 5 to 10 mole % of all $R^2$ groups are alkenyl groups having 2 to 10 carbon atoms; methyl groups constitute 90 mole % or more of the sum of methyl and phenyl groups contained in $R^2$; "e", "f", "g", "h" and "i" are numbers that satisfy the following conditions: $0.4 \le e \le 0.6$; $0 \le f \le 0.05$; $0 \le g \le 0.05$; $0.4 \le h \le 0.6$; $0.01 \le i \le 0.05$; and $e+f+g+h=1$;

(B) an organopolysiloxane that contains silicon-bonded hydrogen atoms and comprises 10 to 50 wt. % of constituent (B-1), 50 to 90 wt. % of constituent (B-2), and 0 to 30 wt. % of constituent (B-3), in an amount that the silicon-bonded hydrogen atoms in component (B) are in the range of 0.5 to 2.0 moles per 1 mole of the total content of alkenyl groups in component (A), wherein constituent (B-1) comprises an organopolysiloxane that contains at least 0.5 wt. % of silicon-bonded hydrogen atoms and that is represented by the following average molecular formula:

$$R^3_3SiO(R^3_2SiO)_j(R^3HSiO)_kSiR^3_3$$

where $R^3$ designates phenyl groups or methyl groups; methyl groups constitute 90 mole % or more of all groups contained in $R^3$; "j" is a number in the range of 0 to 35; and "k" is a number in the range of 5 to 100;

constituent (B-2) comprises an organopolysiloxane that contains at least 0.5 wt. % of silicon-bonded hydrogen atoms and that is represented by the following average compositional formula:

$$(HR^4_2SiO_{1/2})_l(R^4_3SiO_{1/2})_m(R^4_2SiO_{2/2})_n(R^4SiO_{3/2})_o(SiO_{4/2})_p(R^5O_{1/2})_q$$

where $R^4$ designates phenyl groups or methyl groups; methyl groups constitute 90 mole % or more of all groups contained in $R^4$; $R^5$ designates hydrogen atoms or alkyl groups having 1 to 10 carbon atoms; and "l", "m", "n", "o", "p" and "q" are numbers that satisfy the following conditions: $0.4 \le l \le 0.7$; $0 \le m \le 0.2$; $0 \le n \le 0.05$; $0 \le o \le 0.5$; $0.3 \le p \le 0.6$; $0 \le q \le 0.05$; and $l+m+n+o+p=1$;

constituent (B-3) is an organopolysiloxane represented by the following average molecular formula:

$$HR^6_2SiO(R^6_2SiO)_rSiR^6_2H$$

where $R^6$ represents phenyl groups or methyl groups; methyl groups constitute at least 90% of all groups contained in $R^6$; and "r" is a number in the range of 10 to 100; and (C) a hydrosilylation-reaction catalyst, in an amount sufficient for curing the composition.

The composition of the invention may be further provided with (D) fumed silica having BET specific area of 20 to 200 m²/g and added in an amount of 1 to 10 parts by weight per 100 parts by weight of the sum of components (A) to (C).

When the composition of the invention is cured, it forms a cured body that has a type D durometer hardness in the range of 30 to 70 according to JIS K 6253 and that is suitable for use as an agent for sealing or bonding optical semiconductor elements, in particular light emitting diodes.

The optical semiconductor device of the present invention is characterized by having optical semiconductor elements sealed and/or bonded with the use of cured bodies of the aforementioned composition.

Effects of Invention

The curable organopolysiloxane composition of the present invention is characterized by forming a cured body having long-lasting properties of light transmittance and bondability, and having relatively high hardness. The optical semiconductor device of the invention is characterized by excellent reliability.

BRIEF DESCRIPTION OF THE DRAWINGS

FIG. 1 is a sectional view of a surface-mount light emitting diode (LED) illustrated as an example of an optical semiconductor device of the invention.

REFERENCE NUMERALS USED IN THE DESCRIPTION 1 housing made from polyphthalamide resin
2 inner lead
3 die pad
4 bonding material
5 LED chip
6 bonding wire
7 sealing material

| Reference Numerals Used in the Description | |
|---|---|
| 1 | housing made from polyphthalamide resin |
| 2 | inner lead |
| 3 | die pad |
| 4 | bonding material |
| 5 | LED chip |
| 6 | bonding wire |
| 7 | sealing material |

DETAILED DESCRIPTION OF THE INVENTION

Component (A), which is the main component of the composition of the invention, comprises an alkenyl-containing organopolysiloxane that consists of constituents (A-1) and (A-2) which are described below.

Constituent (A-1) is used for improving handleability of the composition and mechanical strength of a cured body. This constituent comprises an organopolysiloxane of the following average compositional formula:

$$(R^1_3SiO_{1/2})_a(R^1_2SiO_{2/2})_b(R^1SiO_{3/2})_c(SiO_{4/2})_d$$

where $R^1$ designates phenyl groups, methyl groups, or alkenyl groups having 2 to 10 carbon atoms. The alkenyl groups of $R^1$ can be represented by vinyl, allyl, butenyl, pentenyl, or hexenyl groups. Vinyl groups are preferable in view of their reactivity and ease of synthesis. However, 0.4 to 50 mole % of all $R^1$ groups are alkenyl groups. This is because if the content of the alkenyl groups is below the recommended lower limit, a cured body of the composition will have low mechanical strength, and if, on the other hand, the content of the alkenyl group exceeds the recommended upper limit, a cured body will become brittle. Furthermore, when the sum of methyl groups and phenyl groups of $R^1$ is assumed as 100%, the methyl groups should constitute 90 mole % of more. This is because if the content of methyl groups is below the recommended lower limit, a cured body of the composition can easily acquire a color at a high temperature. Furthermore, in the above formula, "a", "b", "c", and "d" are numbers that represent ratios of siloxane structural units, and that satisfy the following conditions: $0 \le a \le 0.05$; $0.9 \le b \le 1$; $0 \le c \le 0.03$; $0 \le d \le 0.03$; and $a+b+c+d=1$. If the value of "a" exceeds the recommended upper limit, this will lead to significant decrease in viscosity of this constituent. This, in turn, will either impair handleability of the composition and make the present constituent volatile, or will decrease the weight of the composition during curing and reduce hardness of the cured body. If, on the other hand, the values of "c" and "d" exceed the recommended upper limit, this will increase viscosity of the present constituent, and will either impair handleability of the composition, or will make the cured body too brittle. The value of "b" is determined from the values of "a", "c", and "d". However, if the value of "b" is lower than the recommended lower limit, it will be impossible to impart either desired viscosity to the composition or a required hardness or mechanical strength to a cured body. Constituent (A-1) may have a linear, cyclic, partially cyclic, or a partially branched molecular structure. This constituent is liquid at 25° C. The viscosity of this constituent at 25° C. should be in the range of 3 to 1,000,000 mPa·s, preferably 5 to 50,000 mPa·s. If the viscosity is below the recommended lower limit, this will reduce mechanical strength of a cured body, and, if, on the other hand, the viscosity exceeds the recommended upper limit, this will impair handleability of the composition.

Constituent (A-1) may be represented by organopolysiloxanes expressed by the average compositional formulas given below, where Vi stands for vinyl, Me stands for methyl, and Ph stands for phenyl.

$$(ViMe_2SiO_{1/2})_{0.012}(Me_2SiO_{2/2})_{0.988}$$

$$(ViMe_2SiO_{1/2})_{0.007}(Me_2SiO_{2/2})_{0.993}$$

$$(Me_3SiO_{1/2})_{0.007}(Me_2SiO_{2/2})_{0.983}(MeViSiO_{2/2})_{0.010}$$

$$(Me_3SiO_{1/2})_{0.01}(MeViSiO_{1/2})_{0.01}(Me_2SiO_{2/2})_{0.96}(MeSiO_{3/2})_{0.02}$$

$$(ViMe_2SiO_{1/2})_{0.005}(Me_2SiO_{2/2})_{0.895}(MePhSiO_{2/2})_{0.100}$$

Furthermore, constituent (A-1) may be represented by organopolysiloxanes expressed by the average molecular formulas given below, Vi and Me are the same as defined above.

$$(MeViSiO_{2/2})_3$$

$$(MeViSiO_{2/2})_4$$

$$(MeViSiO_{2/2})_5$$

Constituent (A-2) is an organopolysiloxane that is intended for imparting hardness and mechanical strength to a cured body of the composition. This constituent is represented by the following average compositional formula:

$$(R^2_3SiO_{1/2})_e(R^2_2SiO_{2/2})_f(R^2SiO_{3/2})_g(SiO_{4/2})_h(HO_{1/2})_i$$

In this formula, $R^2$ designates phenyl groups, methyl groups, or alkenyl groups having 2 to 10 carbon atoms. The alkenyl groups of $R^2$ can be represented by vinyl, allyl, butenyl, pentenyl, or hexenyl groups. Vinyl groups are preferable in view of their reactivity and ease of synthesis. However, 5 to 10 mole % of all $R^2$ groups are alkenyl groups. This is because if the content of the alkenyl groups is below the recommended lower limit, a cured body of the composition will have low hardness and mechanical strength, and if, on the other hand, the content of the alkenyl group exceeds the recommended upper limit, a cured body will become brittle. Furthermore, when the sum of methyl groups and phenyl groups of $R^2$ is assumed as 100%, the methyl groups should constitute 90 mole % of more. This is because if the content of methyl groups is lower than the recommended limit, a cured body of the composition can easily acquire a color at a high temperature. Furthermore, in the above formula, "e", "f", "g", "h" and "i" are numbers that represent ratios of siloxane structural units and hydroxyl groups, and that satisfy the following conditions: $0.4 \le e \le 0.6$; $0 \le f \le 0.05$; $0 \le g \le 0.05$; $0.4 \le h \le 0.6$; $0.01 \le i \le 0.05$; and $e+f+g+h=1$. If the value of "e" is below the recommended lower limit, this will reduce mechanical strength of a cured body, and if, on the other hand, the value of "e" exceeds the recommended upper limit, it will be impossible to impart to a cured body a sufficient hardness. If the value of "f" exceeds the recommended upper limit, it will be impossible to impart to a cured body a sufficient hardness. If the value of "g" exceeds the recommended upper limit, this will lower mechanical strength of a cured body. If the value of "h" is below the recommended lower limit, it will be impossible to impart to a cured body a sufficient hardness, and if, on the other hand, the value of "h" exceeds the recommended upper limit, it will impair dispersibility of the component in the composition and will reduce mechanical strength of a cured body of the composition. Finally, in order to provide the composition with good bondability, it is important to maintain the value of "i" within the recommended range. If the value of "i" is below the recommended lower limit, it will be impossible to provide the composition with desired bonding properties, and if, on the other hand, the value of "i" exceeds the recommended upper limit, this will impair dispersibility of this constituent in the composition and will not allow imparting desired mechanical strength and bonding properties to a cured body of the composition. Constituent (A-2) may have a branched or net-like molecular structure. There are no special restrictions with regard to viscosity of this constituent at 25° C. and it may be liquid or solid provided that it is miscible with constituent (A-1).

Constituent (A-2) may be represented by organopolysiloxanes expressed by the average compositional formulas given below, where Vi, Me, and Ph are the same as defined above.

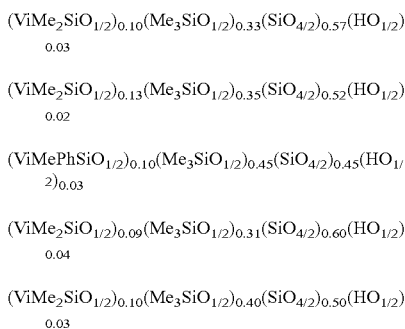

It is recommended that component (A) contains 15 to 35 wt. % of constituent (A-1) and 65 to 85 wt. % of constituent (A-2), and preferably 20 to 30 wt. % of constituent (A-1) and 70 to 80 wt. % of constituent (A-2). If the content of constituent (A-1) exceeds the recommended upper limit, it will be impossible to impart a desired hardness and mechanical strength to a cured body of the composition, and if, on the other hand, the content of constituent (A-1) is below the recommended lower limit, this will impair handleability of the composition and impart brittleness to a cured body.

It is not necessary to premix constituents (A-1) and (A-2) of component (A) if the composition can be eventually prepared in a state of high uniformity. From the viewpoint of good handleability, component (A) should be liquid at 25° C. and have a viscosity in the range of 100 to 5,000,000 mPa·s, preferably 500 to 100,000 mPa·s.

Component (B) is used in the composition as a cross-linking agent. It comprises an organopolysiloxane that has silicon-bonded hydrogen atoms and consists of constituents (B-1), (B-2), and, if necessary, constituent (B-3).

Constituent (B-1) acts not only as a cross-linking agent but also as an efficient interfacial bonding improver. This constituent comprises an organopolysiloxane that is represented by the following average molecular formula:

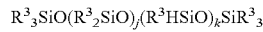

In this formula, $R^3$ designates phenyl groups or methyl groups; methyl groups constitute 90 mole % or more of all groups contained in $R^3$. If the content of methyl groups is below the recommended limit, a cured body will acquire a color at a high temperature. In this formula, "j" is a number in the range of 0 to 35; and "k" is a number in the range of 5 to 100. If the value of "j" exceeds the recommended upper limit, it will be impossible to provide the composition with good bondability. If the value of "k" is below the recommended lower limit, it will be impossible to provide the composition with good bondability, and if, on the other hand, the value of "k" exceeds the recommended upper limit, a cured body will be obtained with low mechanical strength. Furthermore, the content of silicon-bonded hydrogen atoms should be equal to or greater than 0.5 wt. %. If the content of silicon-bonded hydrogen atoms is below 0.5 wt. %, it will be difficult to provide the composition with good bondability. It is recommended that constituent (B-1) be liquid at 25° C. and have viscosity at 25° C. in the range of 3 to 10,000 mPa·s, preferably 5 to 5,000 mPa·s. If the viscosity is below the recommended lower limit, a cured body, this will impair mechanical strength and bonding strength, and if, on the other hand, the viscosity exceeds the recommended upper limit, this will impair handleability of the composition.

Constituent (B-1) may be represented by organopolysiloxanes expressed by the average molecular formulas given below, where Me and Ph are the same as defined above.

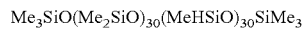

Constituent (B-2) acts not only as a cross-linking agent but also as an efficient agent for improving mechanical strength of a cured body as well as aggregation and bonding properties. Constituent (B-2) comprises an organopolysiloxane that is represented by the following average compositional formula:

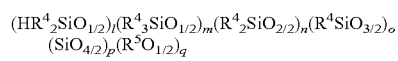

In this formula, $R^4$ designates phenyl groups or methyl groups. Methyl groups constitute 90 mole % or more of all groups contained in $R^4$. If the content of methyl groups is below the recommended limit, this may color the cured body at a high temperature. In the above formula, $R^5$ designates hydrogen atoms or alkyl groups having 1 to 10 carbon atoms. The alkyl groups of $R^5$ having 1 to 10 carbon atoms are represented by methyl, ethyl, and isopropyl groups. Furthermore, in the formula, "l", "m", "n", o", "p" and "q" are numbers that represent ratios of siloxane structural units and hydroxyl groups or alkoxy groups, and that satisfy the following conditions: $0.4 \le l \le 0.7$; $0 \le m \le 0.2$; $0 \le n \le 0.05$; $0 \le o \le 0.5$;

$0.3 \le p \le 0.6$; $0 \le q \le 0.05$; and $l+m+n+o+p=1$. If the value of "l" is below the recommended lower limit, it will be impossible to achieve a desired hardness, and if, on the other hand, the value of "l" exceeds the recommended upper limit, this will reduce molecular weight of the present constituent and will not allow imparting a sufficient mechanical strength to a cured body. Furthermore, if the value of "m" exceeds the recommended upper limit, it will be impossible to achieve a desired hardness. If the value of "n" exceeds the recommended upper limit, it will be impossible to achieve a desired hardness. If the value of "o" exceeds the recommended upper limit, this will impair dispersibility of the constituent and will not allow imparting a sufficient mechanical strength to a cured body. If the value of "p" is below the recommended lower limit, it will be impossible to achieve as a desired hardness, and if, on the other hand, the value of "p" exceeds the recommended upper limit, this will impair dispersibility of the present constituent in the composition and will not allow obtaining a desired mechanical strength. Finally, if the value of "q" exceeds the recommended upper limit, this will reduce molecular weight of the constituent and will not allow imparting a sufficient mechanical strength to a cured body. The present constituent should contain at least 0.5 wt. % of silicon-bonded hydrogen atoms. If the content of silicon-bonded hydrogen atoms is below 0.5 wt. %, it will be impossible to impart sufficient mechanical strength to a cured body. In order to improve miscibility of the present constituent with the composition, this constituent should be liquid or solid at 25° C.

Constituent (B-2) may be represented by organopolysiloxanes expressed by the average compositional formulas given below, where Me and Ph are the same as defined above.

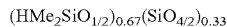
$(HMe_2SiO_{1/2})_{0.67}(SiO_{4/2})_{0.33}$

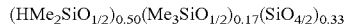
$(HMe_2SiO_{1/2})_{0.50}(Me_3SiO_{1/2})_{0.17}(SiO_{4/2})_{0.33}$

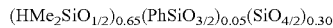
$(HMe_2SiO_{1/2})_{0.65}(PhSiO_{3/2})_{0.05}(SiO_{4/2})_{0.30}$

Constituent (B-3) is an arbitrary component, which is used for controlling hardness of a cured body. This constituent is an organopolysiloxane represented by the following average molecular formula:

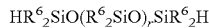
$HR^6{}_2SiO(R^6{}_2SiO)_rSiR^6{}_2H$ where $R^6$ designates phenyl or methyl groups and where methyl groups constitute at least 90% of all groups contained in $R^6$. If the content of methyl groups is below the recommended lower limit, this will color a cured body at a high temperature. In the above formula, "r" designates a number in the range of 10 to 100. If "r" is below the recommended lower limit, it will be difficult to provide a cured body with a desired hardness, and if, on the other hand, the value of "r" exceeds the recommended upper limit, a cured body will lose its mechanical strength.

Constituent (B-3) can be exemplified by organopolysiloxanes that are expressed by the following average molecular formulas, where Me and Ph are the same as defined above:

$HMe_2SiO(Me_2SiO)_{20}SiMe_2H$

$HMe_2SiO(Me_2SiO)_{80}SiMe_2H$

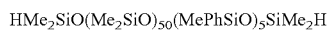
$HMe_2SiO(Me_2SiO)_{50}(MePhSiO)_5SiMe_2H$

Component (B) contains 10 to 50 wt. % of constituent (B-1), 50 to 90 wt. % of constituent (B-2), and 0 to 30 wt. % of constituent (B-3), preferably 25 to 45 wt. % of constituent (B-1), 55 to 75 wt. % of constituent (B-2), and 0 to 25 wt. % of constituent (B-3). If the content of constituent (B-1) exceeds the recommended upper limit, this will reduce mechanical strength of a cured body, and if, on the other hand, the content of constituent (B-1) is below the recommended lower limit, this will reduce bonding properties of a cured body. If the content of constituent (B-2) exceeds the recommended upper limit, this will reduce bonding properties of a cured body, and if, on the other hand, the content of constituent (B-2) is below the recommended lower limit, this will reduce mechanical strength of a cured body. If the content of constituent (B-3) exceeds the recommended upper limit, this will reduce hardness of a cured body. It is not necessary to premix the aforementioned constituents of component (B) if it is eventually possible of obtained the final composition in a state of high uniformity. Component (B) is liquid at 25° C. From the viewpoint of good handleability, component (B) should be liquid at 25° C. and have a viscosity in the range of 5 to 100,000 mPa·s, preferably 10 to 50,000 mPa·s.

Component (B) is added in such an amount that the silicon-bonded hydrogen atoms are in the range of 0.5 to 2.0 moles, preferably 0.8 to 1.8 moles, per 1 mole of the total content of alkenyl groups in component (A). If the content of component (B) is below the recommended lower limit, or exceeds the recommended upper limit, it will be impossible to impart to a cured body of the composition the desired hardness, mechanical characteristics, and bonding properties.

Component (C) is a hydrosilylation-reaction catalyst that is used for accelerating hydrosilylation reaction of the composition. Such a catalyst can be exemplified by a platinum-based catalyst, platinum-based compound catalyst, metallic platinum catalyst, rhodium-based catalyst, or a palladium-based catalyst. From the viewpoint of efficient acceleration of the hydrosilylation reaction of components (A) and (B) and thus for accelerated curing of the composition, it is recommended to employ a platinum-based catalyst. Such a catalyst can be represented by fine platinum powder, platinum black, chloroplatinic acid, an alcohol-modified chloroplatinic acid, a diolefin complex of chloroplatinic acid, an olefin complex of platinum; platinum bis(acetoacetate), platinum bis(acetoacetonate), or a similar platinum-carbonyl complex; a complex of chloroplatinic acid and divinyl-tetramethyl disiloxane, a complex of chloroplatinic acid and tetravinyl-tetramethyl-cyclotetrasilane, or a similar complex of chloroplatinic acid and alkenylsiloxane; a complex of platinum and divinyltetramethyl-disiloxane, a complex of platinum and tetravinyltetramethyl-cyclotetrasiloxane, or a similar complex of platinum and alkenylsiloxane; a complex of chloroplatinic acid and acetylene alcohol, etc. From the viewpoint of hydrosilylation efficiency, it is recommended to use a complex of platinum and an alkenylsiloxane.

The alkenylsiloxane may be exemplified by the following compounds: 1,3-divinyl-1,1,3,3-tetramethyldisiloxane; 1,3,5,7-tetramethyl-1,3,5,7-tetravinyl cyclotetrasiloxane; alkenylsiloxane wherein a part of its methyl groups is substituted with ethyl groups, phenyl groups, etc.; or a similar substituted alkenylsiloxane oligomer; or an alkenylsiloxane oligomer wherein vinyl groups of its alkenylsiloxane are substituted with allyl, hexenyl, or similar groups. Due to the high stability of platinum-alkenylsiloxane complexes, it is recommended to use 1,3-divinyl-1,1,3,3-tetramethyldisiloxane.

Furthermore, in order to further improve the stability of platinum-alkenylsiloxane complexes, they can be combined with 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, or similar alkenylsiloxane oligomers or organosiloxane oligomers such as dimethylsiloxane oligomers, especially alkenylsiloxane oligomers.

There are no special restriction with regard to the amount in which component (C) can be used, provided that it accelerates curing of the composition. More specifically, it is recommended to add component (C) in such an amount that in terms of weight units the content of platinum-type metal atoms, in particular platinum atoms of this component is in the range of 0.01 to 500 ppm, preferably 0.01 to 100 ppm, and more preferably 0.1 to 50 ppm. If the content of component (C) is below the recommended lower limit, it will be difficult to provide sufficient curing, and if, on the other hand, the content of component (C) exceeds the recommended upper limit, this will lead to coloration of the cured body.

In order to improve handleability and bonding properties of the composition, it may be further provided with (D) fumed silica having BET specific area in the range of 20 to 200 m$^2$/g. This component should be used in an amount of 1 to 10 parts by weight per 100 parts by weight of the sum of components (A), (B), and (C). If component (D) is used in such an amount that the BET specific area thereof is below or above the recommended range, this will impair handleability and will not allow obtaining a desired viscosity of the composition. Furthermore, if the content of component (D) exceeds the recommended upper limit, this will impair light transmitting properties.

In order to extend the pot life and storage stability at room temperature, the composition can be further provided with component (E) such as 1-ethynylcyclohexan-1-ol, 2-methyl-3-butyn-2-ol, 3,5-dimethyl-1-hexyn-3-ol, 2-phenyl-3-butyn-2-ol, or similar alkyne alcohols; 3-methyl-3-penten-1-yne, 3,5-dimethyl-3-hexen-1-yne, or similar ene-yne compounds; 1,3,5,7-tetramethyl-1,3,5,7-tetravinylcyclotetrasiloxane, 1,3,5,7-tetramethyl-1,3,5,7-tetrahexenylcyclotetrasiloxane, or similar methylalkenylsiloxane oligomers; dimethyl bis(3-methyl-1-butyn-3-oxy)silane, methylvinyl bis(3-methyl-1-butyn-3-oxy)silane, or similar alkynoxysilanes; benzotriazole, or similar hydrosilylation reaction inhibitors.

Component (E) is used in an amount sufficient for inhibiting gelling or curing the composition during mixing of components (A), (B), and (C) and also in an amount needed for providing long-term storage of the composition. More specifically, it is recommended to add this component in an amount of 0.0001 to 5 parts by weight, preferably 0.01 to 3 parts by weight per 100 parts by weight of the sum of components (A), (B), and (C).

Moreover, to further improve bonding to the substrate that is in contact with the composition during curing, the composition may be combined with (F) an adhesion promoter. Such an adhesion promoter may be one known in the art and used for addition to hydrosilylation-reaction curable organopolysiloxane compositions.

Component (F) may be exemplified by the following compounds: organosilanes or organosiloxane oligomers having 4 to 20 silicon atoms and a linear, branched, or cyclic molecular structure and containing trialkoxysiloxy groups (such as trimethoxysiloxy groups or triethoxysiloxy groups) or trialkoxysilylalkyl groups (such as trimethoxysilylethyl groups or triethoxysilylethyl groups) and hydrosilyl groups or alkenyl groups (such as vinyl groups or allyl groups); organosilanes or organosiloxane oligomers having 4 to 20 silicon atoms and a linear, branched, or cyclic molecular structure and containing trialkoxysiloxy groups or trialkoxysilylalkyl groups and methacryloxyalkyl groups (such as 3-methacryloxypropyl groups); organosilanes or organosiloxane oligomers having 4 to 20 silicon atoms and a linear, branched, or cyclic molecular structure and containing trialkoxysiloxy groups or trialkoxysilylalkyl groups and epoxy-containing alkyl groups (such as 3-glycidoxypropyl groups, 4-glycidoxybutyl groups, 2-(3,4-epoxycyclohexyl)ethyl groups, or 3-(3,4-epoxycyclohexyl)propyl groups); reaction products of aminoalkyltrialkoxysilane and epoxy-bonded alkyltrialkoxysilane; or epoxy-containing ethylpolysilicate. Specific examples are the following compounds: vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, reaction products of 3-glycidoxypropyltriethoxysilane and 3-aminopropyltriethoxysilane; condensation reaction products of 3-glycidoxypropyltrimethoxysilane and methylvinylsiloxane oligomer capped with silanol groups; condensation reaction products of 3-methacryloxypropyltriethoxysilane and methylvinylsiloxane oligomer capped with silanol groups; and tris(3-trimethoxysilylpropyl)isocyanurate.

From the viewpoint of preventing a decrease in resistance to yellowing and in light transparency, when a cured body is used over a long time at elevated temperatures, it is preferable that component (F) does not contain active nitrogen atoms, e.g., amino groups. This adhesion promoter is preferably a low-viscosity liquid that has a viscosity at 25° C. in the range of 1 to 500 mPa·s.

Component (F) should be added in amounts that do not impair curing properties, in particular do not cause change of color in a cured body. More specifically, it should be added in an amount of 0.01 to 5 parts by weight, preferably 0.1 to 3 parts by weight, per 100 parts by weight of the sum of components (A), (B), and (C).

Within the limits not contradicting with the object of the invention, besides component (D), the composition may contain other arbitrary components such as silica, glass, zinc oxide or similar inorganic fillers; silicone rubber powder; silicone resin, polymethacrylate resin, or similar resin powders; heat-resistant agents, dyes, pigments, flame retarders, solvents, etc.

From the viewpoint of handling, it is recommended that the composition is liquid and have a viscosity at 25° C. in the range of 10 to 1,000,000 mPa·s. If the composition is intended for use as a sealant for optical semiconductor elements, it should have a viscosity at 25° C. in the range of 100 to 10,000 mPa·s, and if it is intended for use as a bonding agent for optical semiconductor elements, it should have a viscosity at 25° C. in the range of 1,000 to 500,000 mPa·s.

The composition is cured by retaining at room temperature or by heating. For acceleration of curing, it is recommended to cure the composition by heating. The heating temperature should be in the range of 50 to 200° C.

The composition provides excellent bonding durability, with respect to steel, stainless steel, aluminum, copper, silver, titanium, titanium alloy or other metals or alloys; silicon semiconductors, gallium-phosphorus-based semiconductors, gallium-arsenide-based semiconductors, gallium-nitride-based semiconductors, or similar semiconductor elements; ceramics, glass, thermosetting resins, and thermoplastic resins that contain polar groups, and in particular if the above objects are subject to heating-cooling cycles.

It is recommended that curing of the composition produce a cured body having hardness measured by type D durometer in accordance with JIS K 6253 in the range of 30 to 70. If the cured body has the hardness below the recommended lower limit, it will have poor cohesion and insufficient strength and bonding capacity, and if, on the other hand, the hardness exceed the recommended upper limit, a cured body will acquire brittleness, and it will be impossible to provide sufficient bonding properties.

The following is a detailed description of an optical semiconductor device of the invention.

The optical semiconductor device of the invention comprises an optical semiconductor element that is either sealed in a housing by a cured body of a sealing material formed from the composition of the present invention, or is bonded to the housing with a cured body of a bonding material formed from the composition of the invention. The optical semiconductor element may comprise a light-emitting diode (LED), semiconductor laser, photodiode, photo transistor, solid-state image pickup elements, or a photo-coupler light emitter and receiver. Most suitable application is a LED.

Since in a LED the light is emitted from the semiconductor in a vertical and in a horizontal direction, it is required that the parts of the device be made from materials that do not absorb the light and have either high light transmittance or high coefficient of light reflection. A substrate that supports the optical semiconductor element is also not an exception from this rule. Such a substrate can be made from silver, gold, copper, or another electrically conductive metal; aluminum, nickel or another non-electroconductive metal; PPA (Polyphthalamide), LCP (Liquid Crystal Polymer), or another thermoplastic resin mixed with a white pigment; epoxy resin, BT resin, polyimide resin, silicone resin, or a similar thermosetting resin mixed with a white pigment; alumina, alumina nitride, or similar ceramics. Since the composition of the invention provides good bonding to semiconductor elements and substrates, it improves reliability of the obtained optical semiconductor device.

The optical semiconductor device of the invention is described in more detail with reference to FIG. 1. FIG. 1 is a sectional view of a single surface-mount type LED shown as a typical example of an optical semiconductor device. The LED of FIG. 1 comprises a LED chip 5 which is die-bonded to a die pad 3 through a bonding material 4 inside a housing 1 made from a polyphthalamide resin (PPA). The LED chip 5, in turn, is wire-bonded to inner leads 2 by bonding wires 6, and along with the inner walls of the housing are sealed with a sealing material 7. In the LED of the invention, the composition that is used for forming the bonding material 4 and/or the sealing material 7 is the curable organopolysiloxane composition of the present invention.

EXAMPLES

The curable organopolysiloxane composition of the present invention and the optical semiconductor device of the invention will be further illustrated in more details with reference to application and comparative examples. In these application and comparative examples, the values of viscosity corresponds to 25° C.

Listed below are formulas of the constituents that were used for the preparation of curable organopolysiloxane compositions shown in the application and comparative examples, wherein Vi stands for vinyl groups, Me stands for methyl groups, and Ph stands for phenyl groups; Vi % shows the percentage of vinyl groups (mole %) in all organic groups, and Me % shows the percentage of methyl groups (mole %) in the sum of methyl groups and phenyl groups. Furthermore, in the tables, the SiH/Vi ratio is the ratio of the total number of silicon-bonded hydrogen atoms in constituents (b-1) to (b-6) to 1 mole of the sum of vinyl groups in constituents (a-1) to (a-9) contained in the composition.

Constituent (a-1): organopolysiloxane (Vi %=2.06 mole %; Me %=100 mole %) having viscosity of 60 mPa·s and represented by the following average compositional formula:

$$(Me_2ViSiO_{1/2})_{0.042}(Me_2SiO_{2/2})_{0.958}$$

Constituent (a-2): organopolysiloxane (Vi %=0.60 mole %; Me %=100 mole %) having viscosity of 550 mPa·s and represented by the following average compositional formula:

$$(Me_2ViSiO_{1/2})_{0.012}(Me_2SiO_{2/2})_{0.988}$$

Constituent (a-3): organopolysiloxane (Vi %=50 mole %; Me %=100 mole %) having viscosity of 4 mPa·s and represented by the following average molecular formula:

$$(MeViSiO_{2/2})_4$$

Constituent (a-4): organopolysiloxane (Vi %=5.8 mole %; Me %=100 mole %) which is solid at 25° C. and is represented by the following average compositional formula:

$$(Me_2ViSiO_{1/2})_{0.09}(Me_3SiO_{1/2})_{0.43}(SiO_{4/2})_{0.48}(HO_{1/2})_{0.03}$$

Constituent (a-5): organopolysiloxane (Vi %=6.1 mole %; Me %=100 mole %) which is solid at 25° C. and is represented by the following average compositional formula:

$$(Me_2ViSiO_{1/2})_{0.10}(Me_3SiO_{1/2})_{0.45}(SiO_{4/2})_{0.45}(HO_{1/2})_{0.02}$$

Constituent (a-6): organopolysiloxane (Vi %=5.8 mole %; Me %=100 mole %) which is solid at 25° C. and is represented by the following average compositional formula:

$$(Me_2ViSiO_{1/2})_{0.09}(Me_3SiO_{in})_{0.43}(SiO_{4/2})_{0.48}(HO_{1/2})_{0.005}$$

Constituent (a-7): organopolysiloxane (Vi %=6.4 mole %; Me %=100 mole %) which is solid at 25° C. and is represented by the following average compositional formula:

$$(Me_2ViSiO_{1/2})_{0.10}(Me_3SiO_{1/2})_{0.42}(SiO_{4/2})_{0.48}(HO_{1/2})_{0.07}$$

Constituent (a-8): organopolysiloxane (Vi %=8.5 mole %; Me %=100 mole %) which is solid at 25° C. and is represented by the following average compositional formula:

$$(Me_2ViSiO_{1/2})_{0.17}(Me_3SiO_{1/2})_{0.50}(SiO_{4/2})_{0.33}(HO_{1/2})_{0.04}$$

Constituent (a-9): organopolysiloxane (Vi %=4.8 mole %; Me %=100 mole %) which has viscosity of 500 mPa·s at 25° C. and is represented by the following average compositional formula:

$$(Me_2ViSiO_{1/2})_{0.05}(Me_3SiO_{1/2})_{0.30}(SiO_{4/2})_{0.65}(HO_{1/2})_{0.03}$$

Constituent (b-1): organopolysiloxane (Me %=100 mole %) which has viscosity of 10 mPa·s, contains 1.3 wt. % of silicon-bonded hydrogen atoms, and is represented by the following average molecular formula:

$$Me_3SiO(MeHSiO)_{10}SiMe_3$$

Constituent (b-2): organopolysiloxane (Me %=100 mole %) which has viscosity of 200 mPa·s, contains 0.72 wt. % of silicon-bonded hydrogen atoms, and is represented by the following average molecular formula:

$$Me_3SiO(Me_2SiO)_{30}(MeHSiO)_{30}SiMe_3$$

Constituent (b-3): organopolysiloxane (Me %=100 mole %) which has viscosity of 200 mPa·s, contains 0.34 wt. % of silicon-bonded hydrogen atoms, and is represented by the following average molecular formula:

$Me_3SiO(Me_2SiO)_{45}(MeHSiO)_{15}SiMe_3$

Constituent (b-4): organopolysiloxane (Me %=100 mole %) which has viscosity of 120 mPa·s, contains 1.03 wt. % of silicon-bonded hydrogen atoms, and is represented by the following average compositional formula:

$(HMe_2SiO_{1/2})_{0.67}(SiO_{4/2})_{0.33}$

Constituent (b-5): organopolysiloxane (Me %=100 mole %) which has viscosity of 130 mPa·s, contains 0.74 wt. % of silicon-bonded hydrogen atoms, and is represented by the following average compositional formula:

$(HMe_2SiO_{1/2})_{0.50}(Me_3SiO_{1/2})_{0.17}(SiO_{4/2})_{0.33}$

Constituent (b-6): organopolysiloxane (Me %=75 mole %) which has viscosity of 200 mPa·s, contains 0.65 wt. % of silicon-bonded hydrogen atoms, and is represented by the following average compositional formula:

$(HMe_2SiO_{1/2})_{0.60}(PhSiO_{3/2})_{0.40}$

Constituent (c): 1.3-divinyl-1,1,3,3-tetramethyldisiloxane solution of complex of platinum and 1,3-divinyl-1,1,3,3-tetramethyldisiloxane (contains about 4 wt. % of metallic platinum)

Constituent (d-1): fumed silica having BET surface area in the range of 115 to 165 m²/g and hydrophobized by surface treatment with hexamethyl disilazane (RX200, the product of Nippon Aerosil Co., Ltd.)

Constituent (d-2): fumed silica having BET surface area in the range of 30 to 50 m²/g and hydrophobized by surface treatment with hexamethyl disilazane (NAX50, the product of Nippon Aerosil Co., Ltd.)

Constituent (e): 1-ethynylcyclohexan-1-ol

Constituent (f): condensation reaction product of 3-glycidoxypropyltrimethoxysilane and methylvinylsiloxane oligomer capped at both molecular terminals with silanol groups and having viscosity of 30 mPa·s.

Viscosity of the curable organopolysiloxane compositions, as well as hardness, light transmittance, and bonding strength of the cured bodies mentioned in the application and comparative examples were measured by the methods described below.

[Viscosity of the Curable Organopolysiloxane Composition]

This characteristic was measured after the preparation of the curable organopolysiloxane composition within 30 min. by means of a viscometer (AR-550, the product of TA Instrument Co., Ltd.) and by using a 2° cone plate of 20 mm diameter at a shear speed of 10 (1/s).

[Hardness of Cured Body]

The curable organopolysiloxane was formed into a cured sheet-like body by press forming for 1 hour at 150° C., and the latter was used for measuring hardness with type D durometer according to JIS K 6253.

Furthermore, the sheet-like cured body was retained for 1,000 hours in an oven at 150° C., and then hardness after heat-resistance test was measured by the same method as mentioned above.

[Light-Transmitting Properties of Cured Body]

The curable organopolysiloxane composition was sandwiched between two glass plates and cured by holding it for 1 hour at 150° C. Light-transmitting properties of the obtained cured body were measured at 25° C. by a self-recording spectrophotometer (optical path: 0.1 cm) capable of measuring at any wavelength of visible light (the wavelength range of 400 nm to 700 nm). Light transmission through the cured body was determined by subtracting light transmission through the glass only from light transmission through the glass and the composition. The light transmittance obtained for wavelength 450 nm is shown in Table 1.

Furthermore, the aforementioned cured body was retained for 1,000 hours in an oven at 150° C., and then light transmittance after heat-resistance test was measured by the same method as mentioned above.

[Bonding Strength of Cured Body]

Spacers made from polytetrafluoroethylene (width: 10 mm; length: 20 mm; thickness: 1 mm) were sandwiched between two silver-plated steel plates (width: 25 mm; length: 50 mm; thickness: 1 mm). The gap between the plates was filled with the curable organopolysiloxane composition, the plates were clipped together, and the composition was cured by retaining the unit for 1 hour at 150° C. in a hot-air-circulation type oven. After cooling to room temperature, the clip and the spacers were removed, and the bonding strength of a cured body was measured by stretching the obtained specimen in mutually opposite horizontal directions in a tensile test machine.

Furthermore, the aforementioned specimen was retained for 1000 hours in an oven at 150° C., and then the bonding strength after heat-resistance test was measured by the same method as mentioned above.

Application Examples 1 to 4, Comparative Examples 1 to 6

Curable organopolysiloxane compositions were prepared with component ratios shown in Table 1. Properties of cured bodies measured as described above are also shown in Table 1.

TABLE 1

| | | Examples | | | | | | | | | |
| | | Application Examples | | | | Comparative Examples | | | | | |
| | Characteristics | 1 | 2 | 3 | 4 | 1 | 2 | 3 | 4 | 5 | 6 |
|---|---|---|---|---|---|---|---|---|---|---|---|
| Curable | Constituent (a-1) | 20.32 | — | — | 15.87 | — | 21.37 | — | — | 21.19 | 20.66 |
| Organopolysiloxane | Constituent (a-2) | — | 11.54 | 16.67 | — | 16.67 | — | 11.54 | 16.67 | — | — |
| Composition | Constituent (a-3) | — | 3.85 | 8.33 | 7.94 | 8.33 | — | 3.85 | 8.33 | 4.24 | 4.13 |
| (parts by weight) | Constituent (a-4) | — | 61.54 | — | 55.56 | — | — | — | — | — | — |
| | Constituent (a-5) | 66.96 | — | 58.33 | — | — | — | — | — | 59.32 | 57.85 |
| | Constituent (a-6) | — | — | — | — | 58.33 | — | — | — | — | — |
| | Constituent (a-7) | — | — | — | — | — | — | — | 58.33 | — | — |
| | Constituent (a-8) | — | — | — | — | — | 64.10 | — | — | — | — |
| | Constituent (a-9) | — | — | — | — | — | — | 61.54 | — | — | — |

TABLE 1-continued

|  |  |  | Examples | | | | | | | | | |
|---|---|---|---|---|---|---|---|---|---|---|---|---|
|  |  |  | Application Examples | | | | Comparative Examples | | | | | |
|  |  | Characteristics | 1 | 2 | 3 | 4 | 1 | 2 | 3 | 4 | 5 | 6 |
|  |  | Constituent (b-1) | 3.57 | — | 4.17 | 4.76 | 6.67 | 4.27 | — | 4.17 | — | 4.96 |
|  |  | Constituent (b-2) | — | 7.69 | — | — | — | — | 7.69 | — | — | — |
|  |  | Constituent (b-3) | — | — | — | — | — | — | — | — | 5.08 | — |
|  |  | Constituent (b-4) | 7.14 | — | 12.50 | 15.87 | 10.00 | 10.26 | — | 12.50 | 10.17 | — |
|  |  | Constituent (b-5) | — | 15.38 | — | — | — | — | 15.38 | — | — | — |
|  |  | Constituent (b-6) | — | — | — | — | — | — | — | — | — | 12.40 |
|  |  | Constituent (c) | 0.025 | 0.025 | 0.025 | 0.025 | 0.025 | 0.025 | 0.025 | 0.025 | 0.025 | 0.025 |
|  |  | Constituent (e) | 0.030 | 0.030 | 0.030 | 0.030 | 0.030 | 0.030 | 0.030 | 0.030 | 0.030 | 0.030 |
|  |  | Constituent (f) | 0.50 | 0.50 | 1.0 | 1.0 | 1.0 | 0.50 | 0.50 | 0.50 | 0.50 | 0.50 |
|  |  | SiH/Vi ratio | 1.16 | 1.38 | 1.02 | 1.33 | 1.11 | 1.05 | 1.85 | 1.02 | 0.86 | 1.05 |
|  |  | Viscosity (Pa · s) | 7.5 | 3.8 | 2.5 | 1.2 | 4.3 | 7.4 | 3.9 | 2.4 | 3.3 | 3.6 |
| Cured Body | Initial | Type D Durometer hardness | 32 | 51 | 61 | 66 | 23 | 33 | 48 | 62 | 56 | 54 |
|  |  | Light transmittance (%) | 99 | 99 | 99 | 99 | 97 | 98 | 97 | 99 | 98 | 98 |
|  |  | Bonding strength (MPa) | 8.7 | 7.6 | 8.2 | 8.4 | 2.5 | 4.0 | 3.5 | 1.0 | 3.3 | 4.5 |
|  | After | Type D Durometer hardness | 34 | 52 | 62 | 66 | 31 | 34 | 51 | 62 | 57 | 56 |
|  | Heating | Light transmittance (%) | 99 | 99 | 99 | 99 | 92 | 98 | 95 | 99 | 98 | 98 |
|  |  | Bonding strength (MPa) | 8.1 | 7.2 | 8.1 | 8.0 | 2.1 | 3.0 | 2.2 | 0.2 | 1.2 | 2.8 |

Application Examples 5 to 8, Comparative Examples 7 to 12

Curable organopolysiloxane compositions were prepared with component ratios shown in Table 2. Properties of cured bodies measured as described above are also shown in Table 2.

TABLE 2

|  |  | Examples | | | | | | | | | |
|---|---|---|---|---|---|---|---|---|---|---|---|
|  |  | Application Examples | | | | Comparative Examples | | | | | |
|  | Characteristics | 5 | 6 | 7 | 8 | 7 | 8 | 9 | 10 | 11 | 12 |
| Curable | Constituent (a-1) | 20.32 | — | — | 15.87 | — | 21.37 | — | — | 21.19 | 20.66 |
| Organopolysiloxane | Constituent (a-2) | — | 11.54 | 16.67 | — | 16.67 | — | 11.54 | 16.67 | — | — |
| Composition | Constituent (a-3) | — | 3.85 | 8.33 | 7.94 | 8.33 | — | 3.85 | 8.33 | 4.24 | 4.13 |
| (parts by weight) | Constituent (a-4) | — | 61.54 | — | 55.56 | — | — | — | — | — | — |
|  | Constituent (a-5) | 66.96 | — | 58.33 | — | — | — | — | — | 59.32 | 57.85 |
|  | Constituent (a-6) | — | — | — | — | 58.33 | — | — | — | — | — |
|  | Constituent (a-7) | — | — | — | — | — | — | — | 58.33 | — | — |
|  | Constituent (a-8) | — | — | — | — | — | 64.10 | — | — | — | — |
|  | Constituent (a-9) | — | — | — | — | — | — | 61.54 | — | — | — |
|  | Constituent (b-1) | 3.57 | — | 4.17 | 4.76 | 6.67 | 4.27 | — | 4.17 | — | 4.96 |
|  | Constituent (b-2) | — | 7.69 | — | — | — | — | 7.69 | — | — | — |
|  | Constituent (b-3) | — | — | — | — | — | — | — | — | 5.08 | — |
|  | Constituent (b-4) | 7.14 | — | 12.50 | 15.87 | 10.00 | 10.26 | — | 12.50 | 10.17 | — |
|  | Constituent (b-5) | — | 15.38 | — | — | — | — | 15.38 | — | — | — |
|  | Constituent (b-6) | — | — | — | — | — | — | — | — | — | 12.40 |
|  | Constituent (c) | 0.025 | 0.025 | 0.025 | 0.025 | 0.025 | 0.025 | 0.025 | 0.025 | 0.025 | 0.025 |
|  | Constituent (d-1) | 2.0 | — | — | 3.0 | — | 2.0 | — | — | 2.0 | 2.0 |
|  | Constituent (d-2) | — | 2.0 | 3.0 | — | 2.0 | — | 2.0 | 3.0 | — | — |
|  | Constituent (e) | 0.030 | 0.030 | 0.030 | 0.030 | 0.030 | 0.030 | 0.030 | 0.030 | 0.030 | 0.030 |
|  | Constituent (f) | 0.50 | 0.50 | 1.0 | 1.0 | 1.0 | 0.50 | 0.50 | 0.50 | 0.50 | 0.50 |
|  | SiH/Vi ratio | 1.16 | 1.38 | 1.02 | 1.33 | 1.11 | 1.05 | 1.85 | 1.02 | 0.86 | 1.05 |
|  | Viscosity (Pa · s) | 12.5 | 8.0 | 11.0 | 13.0 | 8.4 | 10.2 | 6.5 | 12.0 | 13.3 | 14.0 |
| Cured Body Initial | Type D Durometer hardness | 33 | 52 | 61 | 66 | 24 | 35 | 48 | 62 | 57 | 56 |
|  | Light transmittance (%) | 96 | 92 | 91 | 95 | 94 | 96 | 92 | 93 | 97 | 96 |
|  | Bonding strength (MPa) | 9.3 | 8.7 | 8.9 | 9.5 | 3.6 | 4.5 | 4.0 | 1.5 | 4.5 | 5.0 |
| After Heating | Type D Durometer hardness | 35 | 53 | 62 | 66 | 31 | 36 | 51 | 63 | 57 | 57 |
|  | Light transmittance (%) | 96 | 91 | 93 | 95 | 76 | 96 | 94 | 92 | 96 | 97 |
|  | Bonding strength (MPa) | 9.4 | 8.8 | 9.2 | 9.7 | 1.6 | 4.8 | 4.4 | 1.8 | 5.3 | 6.5 |

INDUSTRIAL APPLICABILITY

The curable organopolysiloxane composition of the invention can be used as a sealant and a bonding agent for optical semiconductor elements of LEDs, semiconductor lasers, photodiodes, photo transistors, solid-state image pickup elements, photo-coupler light emitters and receivers, etc. The optical semiconductor devices of the invention may be used as optical devices, optical instruments, lighting devices, illumination devices, or similar optical semiconductor devices.

The invention claimed is:

1. A curable organopolysiloxane composition comprising at least the following components:

(A) an alkenyl-containing organopolysiloxane that comprises 15 to 35 wt. % of constituent (A-1) and 65 to 85 wt. % of constituent (A-2), wherein
constituent (A-1) comprises an organopolysiloxane of the following average compositional formula:

$$(R^1{}_3SiO_{1/2})_a(R^1{}_2SiO_{2/2})_b(R^1SiO_{3/2})_c(SiO_{4/2})_d$$

where $R^1$ designates phenyl groups, methyl groups, or alkenyl groups having 2 to 10 carbon atoms; 0.4 to 50 mole % of all $R^1$ groups are alkenyl groups having 2 to 10 carbon atoms; methyl groups constitute 90 mole % or more of the sum of methyl and phenyl groups contained in $R^1$; "a", "b", "c", and "d" are numbers that satisfy the following conditions: $0 \le a \le 0.05$; $0.9 \le b \le 1$; $0 \le c \le 0.03$; $0 \le d \le 0.03$; and $a+b+c+d=1$;
constituent (A-2) comprises an organopolysiloxane of the following average compositional formula:

$$(R^2{}_3SiO_{1/2})_e(R^2{}_2SiO_{2/2})_f(R^2SiO_{3/2})_g(SiO_{4/2})_h(HO_{1/2})_i$$

where $R^2$ designates phenyl groups, methyl groups, or alkenyl groups having 2 to 10 carbon atoms; 5 to 10 mole % of all $R^2$ groups are alkenyl groups having 2 to 10 carbon atoms; methyl groups constitute 90 mole % or more of the sum of methyl and phenyl groups contained in $R^2$; "e", "f", "g", "h" and "i" are numbers that satisfy the following conditions: $0.4 \le e \le 0.6$; $0 \le f \le 0.05$; $0 \le g \le 0.05$; $0.4 \le h \le 0.6$; $0.01 \le i \le 0.05$; and $e+f+g+h=1$;

(B) an organopolysiloxane that contains silicon-bonded hydrogen atom and comprises 10 to 50 wt. % of constituent (B-1), 50 to 90 wt. % of constituent (B-2), and 0 to 30 wt. % of constituent (B-3); in an amount that the silicon-bonded hydrogen atoms in component (B) are in the range of 0.5 to 2.0 moles per 1 mole of the total content of alkenyl groups in component (A), wherein
constituent (B-1) comprises an organopolysiloxane that contains at least 0.5 wt. % of silicon-bonded hydrogen atoms and that is represented by the following average molecular formula:

$$R^3{}_3SiO(R^3{}_2SiO)_j(R^3HSiO)_kSiR^3{}_3$$

where $R^3$ designates phenyl groups or methyl groups; methyl groups constitute 90 mole % or more of all groups contained in $R^3$; "j" is a number in the range of 0 to 35; and "k" is a number in the range of 5 to 100;
constituent (B-2) comprises an organopolysiloxane that contains at least 0.5 wt. % of silicon-bonded hydrogen atoms and that is represented by the following average compositional formula:

$$(HR^4{}_2SiO_{1/2})_l(R^4{}_3SiO_{1/2})_m(R^4{}_2SiO_{2/2})_n(R^4SiO_{3/2})_o(SiO_{4/2})_p(R^5O_{1/2})_q$$

where $R^4$ designates phenyl groups or methyl groups; methyl groups constitute 90 mole % or more of all groups contained in $R^4$; $R^5$ designates hydrogen atoms or alkyl groups having 1 to 10 carbon atoms; and "l", "m", "n", "o", "p" and "q" are numbers that satisfy the following conditions: $0.4 \le l \le 0.7$; $0 \le m \le 0.2$; $0 \le n \le 0.05$; $0 \le o \le 0.5$; $0.3 \le p \le 0.6$; $0 \le q \le 0.05$; and $l+m+n+o+p=1$;
constituent (B-3) is an organopolysiloxane represented by the following average molecular formula:

$$HR^6{}_2SiO(R^6{}_2SiO)_rSiR^6{}_2H$$

where $R^6$ represents phenyl or methyl groups; methyl groups constitute at least 90% of all groups contained in $R^6$; and "r" is a number in the range of 10 to 100; and (C) a hydrosilylation-reaction catalyst, in an amount sufficient for curing the composition.

2. The curable organopolysiloxane composition of claim 1, further comprising (D) fumed silica having BET specific area of 20 to 200 m²/g and added in an amount of 1 to 10 parts by weight per 100 parts by weight of the sum of components (A) to (C).

3. A cured body of the curable organopolysiloxane composition of claim 1, wherein the cured body has a type D durometer hardness in the range of 30 to 70 according to JIS K 6253.

4. The curable organopolysiloxane composition of claim 1, further comprising a sealant or a bonding agent for optical semiconductor elements.

5. The curable organopolysiloxane composition of claim 4, wherein the optical semiconductor elements are light emitting diodes.

6. An optical semiconductor device, comprising at least one optical semiconductor element, wherein the at least one optical semiconductor element is sealed and/or bonded with a cured body of the curable organopolysiloxane composition of claim 1.

7. The optical semiconductor device of claim 6, wherein the at least one optical semiconductor element is a light emitting diode.

8. An optical semiconductor device, comprising a plurality of optical semiconductor elements, wherein each optical semiconductor element is sealed and/or bonded with a cured body of the curable organopolysiloxane composition of claim 1.

9. The curable organopolysiloxane composition of claim 1, wherein constituent (A-1) has a viscosity at 25° C. in the range of 3 to 1,000,000 mPa·s.

10. The curable organopolysiloxane composition of claim 1, wherein component (A) has a viscosity at 25° C. in the range of 100 to 5,000,000 mPa·s.

11. The curable organopolysiloxane composition of claim 1, wherein constituent (B-1) has a viscosity at 25° C. in the range of 3 to 10,000 mPa·s.

12. The curable organopolysiloxane composition of claim 1, wherein component (B) has a viscosity at 25° C. in the range of 5 to 100,000 mPa·s.

13. The curable organopolysiloxane composition of claim 1, wherein constituent (B-1) is an interfacial bonding improver.

14. The curable organopolysiloxane composition of claim 1, further comprising a pot life extender in an amount of 0.0001 to 5 parts by weight of the sum of components (A), (B) and (C).

15. The curable organopolysiloxane composition of claim 1, further comprising an adhesion promoter that does not contain active nitrogen atoms.

16. A curable organopolysiloxane composition comprising at least the following components:

(A) an alkenyl-containing organopolysiloxane that comprises constituent (A-1) and constituent (A-2), wherein constituent (A-1) comprises an organopolysiloxane of the following average compositional formula:

$$(R^1{}_3SiO_{1/2})_a(R^1{}_2SiO_{2/2})_b(R^1SiO_{3/2})_c(SiO_{4/2})_d$$

where $R^1$ designates phenyl groups, methyl groups, or alkenyl groups having 2 to 10 carbon atoms; 0.4 to 50 mole % of all $R^1$ groups are alkenyl groups having 2 to 10 carbon atoms; methyl groups constitute 90 mole % or more of the sum of methyl and phenyl groups contained in $R^1$; "a", "b", "c", and "d" are numbers that satisfy the following conditions: $0 \le a \le 0.05$; $0.9 \le b \le 1$; $0 \le c \le 0.03$; $0 \le d \le 0.03$; and $a+b+c+d=1$;
constituent (A-2) comprises an organopolysiloxane of the following average compositional formula:

$$(R^2{}_3SiO_{1/2})_e(R^2{}_2SiO_{2/2})_f(R^2SiO_{3/2})_g(SiO_{4/2})_h(HO_{1/2})_i$$

where $R^2$ designates phenyl groups, methyl groups, or alkenyl groups having 2 to 10 carbon atoms; 5 to 10 mole % of all $R^2$ groups are alkenyl groups having 2 to 10 carbon atoms; methyl groups constitute 90 mole % or more of the sum of methyl and phenyl groups contained in $R^2$; "e", "f", "g", "h" and "i" are numbers that satisfy the following conditions: $0.4 \le e \le 0.6$; $0 \le f \le 0.05$; $0 \le g \le 0.05$; $0.4 \le h \le 0.6$; $0.01 \le i \le 0.05$; and $e+f+g+h=1$;

(B) an organopolysiloxane that contains silicon-bonded hydrogen atom and comprises constituent (B-1) and constituent (B-2); in an amount that the silicon-bonded hydrogen atoms in component (B) are in the range of 0.5 to 2.0 moles per 1 mole of the total content of alkenyl groups in component (A), wherein constituent (B-1) comprises an organopolysiloxane that contains at least 0.5 wt. % of silicon-bonded hydrogen atoms and that is represented by the following average molecular formula:

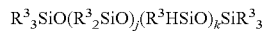

where $R^3$ designates phenyl groups or methyl groups; methyl groups constitute 90 mole % or more of all groups contained in $R^3$; "j" is a number in the range of 0 to 35; and "k" is a number in the range of 5 to 100;

constituent (B-2) comprises an organopolysiloxane that contains at least 0.5 wt. % of silicon-bonded hydrogen atoms and that is represented by the following average compositional formula:

$$(HR^4{}_2SiO_{1/2})_l(R^4{}_3SiO_{1/2})_m(R^4{}_2SiO_{2/2})_n(R^4SiO_{3/2})_o(SiO_{4/2})_p(R^5O_{1/2})_q$$

where $R^4$ designates phenyl groups or methyl groups; methyl groups constitute 90 mole % or more of all groups contained in $R^4$; $R^5$ designates hydrogen atoms or alkyl groups having 1 to 10 carbon atoms; and "l", "m", "n", "o", "p" and "q" are numbers that satisfy the following conditions: $0.4 \le l \le 0.7$; $0 \le m \le 0.2$; $0 \le n \le 0.05$; $0 \le o \le 0.5$; $0.3 \le p \le 0.6$; $0 \le q \le 0.05$; and $l+m+n+o+p=1$; and (C) a hydrosilylation-reaction catalyst, in an amount sufficient for curing the composition.

17. A curable organopolysiloxane composition of claim 16, wherein component (A) comprises 20 to 30 wt. % of constituent (A-1) and 70 to 80 wt. % of constituent (A-2).

18. A curable organopolysiloxane composition of claim 16, wherein component (B) comprises 25 to 45 wt. % of constituent (B-1) and 55 to 75 wt. % of constituent (B-2).

* * * * *